United States Patent [19]

Havemann et al.

[11] Patent Number: 4,541,167
[45] Date of Patent: Sep. 17, 1985

[54] METHOD FOR INTEGRATED CIRCUIT DEVICE ISOLATION

[75] Inventors: Robert H. Havemann, Garland; Gordon P. Pollack, Richardson, both of Tex.

[73] Assignee: Texas Instruments Incorporated, Dallas, Tex.

[21] Appl. No.: 570,145

[22] Filed: Jan. 12, 1984

[51] Int. Cl.$^4$ ............................................. H01L 21/76
[52] U.S. Cl. .................................. 29/576 W; 29/578; 148/DIG. 50
[58] Field of Search ............ 29/578, 580, 571, 576 W; 148/174, 175, 187, DIG. 117, DIG. 50; 427/94, 93

[56] References Cited

U.S. PATENT DOCUMENTS

| | | | |
|---|---|---|---|
| 3,900,350 | 8/1975 | Appels et al. | 148/175 |
| 4,419,142 | 12/1983 | Matskawa | 148/1.5 |
| 4,441,941 | 4/1984 | Nozawa | 148/187 |

*Primary Examiner*—Brian E. Hearn
*Assistant Examiner*—Alan E. Schiavelli
*Attorney, Agent, or Firm*—Kenneth C. Hill; Robert O. Groover; James T. Comfort

[57] ABSTRACT

The disclosure relates to a method manufacturing semiconductor devices which minimizes encroachment by utilizing a polycrystalline silicon (polysilicon) layer over a grown oxide on the substrate with a nitride layer positioned above the polysilicon layer. A patterned resist is then formed in the active device regions and the device is then etched in the regions where the resist has not been applied to remove the nitride layer, the polysilicon layer and the oxide layer in one embodiment and, in a second embodiment, also removes a portion of the substrate. The silicon substrate portion which is exposed is then oxidized by field oxidation to provide, in the first embodiment, an oxide layer which rises above the level of the polysilicon layer and, in the second embodiment, to a point equal to or slightly above the oxide layer beneath the polysilicon layer. The nitride and polysilicon layer are then stripped or, alternatively, the polysilicon layer can be oxidized. The oxide layer in the active region is then etched back to the silicon layer and a gate oxide is then formed in the active region in standard manner. The processing then continues in standard manner to provide an MOS or bipolar device. The above noted procedure provides active semiconductor devices with essentially no encroachment or "bird beak" problem present. The procedure can also be used with elimination of the first oxide layer over the substrate.

3 Claims, 8 Drawing Figures

METHOD FOR INTEGRATED CIRCUIT DEVICE ISOLATION

BACKGROUND OF THE INVENTION

1. Field of the Invention

This invention relates to a method of manufacturing semiconductor devices and, more specifically, to such a method with minimization of "bird beak" or oxide encroachment into the active device region.

2. Description of the Prior Art

In the prior art methods of manufacture of MOS and bipolar semiconductor devices, some of the processing steps require that portions of the silicon substrate be prevented from being oxidized during oxidation of other portions of the substrate device. In order to accomplish this selective oxidation inhibition feature, silicon nitride has been utilized as a mask in the regions wherein oxidation inhibition is to occur, such as the device active or moat region, to prevent oxidation of the substrate therebelow. This has caused a problem wherein the silicon nitride layer on the silicon layer or substrate develops too much stress on the silicon layer. Accordingly, the prior art has placed a stress relieving buffer between the silicon nitride layer and the silicon substrate, usually in the form of an oxide and preferably a silicon oxide. The oxide layer must be of a certain minimum thickness to perform its function or this leads to defects and leakage in the devices formed at the edge of the isolation region. A further problem caused by use of the buffer region is that enhanced oxidation is provided in the buffer region and forms a channel which develops what is known as "bird beak" or oxide encroachment into the active device region of the substrate. This encroachment creates problems in that it limits the usable active device area because, for example, in MOS devices, a certain gate device thickness is expected and that thickness should be constant up to the edge of the isolation region. This cannot be accomplished when oxide encroachment is present.

Many techniques have been attempted to eliminate the above described encroachment problem. The obvious approach is to decrease the oxide thickness and this has been attempted for many years but without success because the defect problem has always appeared. Other proposals have attempted to grow a nitride layer on the silicon which is deposited in such a way that it matches the stoichiometry of the silicon structure. The nitride layers that are normally used are deposited in a low pressure CVD reactor and there is a great deal of stress where the nitride contacts the silicon. It is therefor clear that, by these direct deposition techniques, it has not been possible to obtain nitride layers of more than about 50 Angstroms thickness whereas less than 100 Angstroms of silicon nitride will not mask a thick oxide growth. It is therefore apparent that eventually the nitride is consumed and converted and the active device region starts to oxidize.

SUMMARY OF THE INVENTION

In accordance with the present invention, there is provided a method of manufacturing semiconductor devices which minimizes encroachment or "bird beak" and which requires no process tricks, is very simple and straight forward in technique and basically takes advantage of what has always been known which that, when the oxide layer is thinned out, the encroachment is limited. Briefly, this is accomplished by utilizing a polycrystalline silicon (polysilicon) layer over a grown oxide on the substrate with a nitride layer positioned above the polysilicon layer. A patterned resist is then formed in the active device regions and the device is then etched in the regions where the resist has not been applied to remove the nitride layer, the polysilicon layer and the oxide layer in one embodiment and, in a second embodiment, also removes a portion of the substrate. The silicon substrate portion which is exposed is then oxidized by field oxidation to provide, in the first embodiment, an oxide layer which rises above the level of the polysilicon layer and, in the second embodiment, to a point equal to or slightly above the oxide layer beneath the polysilicon layer. The nitride and polysilicon layer are then stripped or, alternatively, the polysilicon layer can be oxidized. The oxide layer in the active region is then etched back to the silicon layer and a gate oxide is then formed in the active region in standard manner. The processing then continues in standard manner to provide an MOS or bipolar device. The above noted procedure provides active semiconductor devices with essentially no encroachment or "bird beak" problem present. The procedure can also be used with elimination to the first oxide layer over the substrate.

BRIEF DESCRIPTION OF THE DRAWINGS

FIG. 1c' is a schematic diagram as in FIG. 1c for a second embodiment of the invention; and FIG. 1d' is a schematic diagram as in FIG. 1d for the second embodiment of the invention.

DESCRIPTION OF THE PREFERRED EMBODIMENTS

Figure 1A:
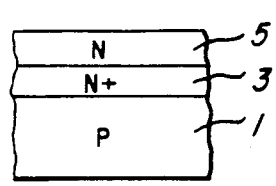
FIGS. 1a through 1f are schematic diagrams showing the steps utilized in formation of a semiconductor device using the process of the present invention.
Figure 1D:
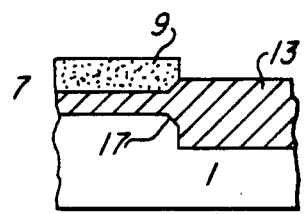
Figure 1B:
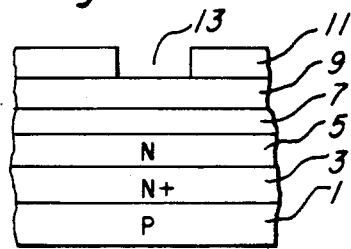

Referring first to FIG. 1a, there is shown a P-type substrate 1 into which has been implanted in N+ layer 3 and which also contains an N-type epitaxial layer 5. With reference now to FIG. 1b, an oxide layer 7 is formed over the top surface of the substrate 1, this appearing over the N-type region 5. This oxide layer 7 is a buffer pad and is on the order of 100 Angstrom units in thickness.

It should be understood that, in accordance with the procedures of this invention, operable devices can be formed utilizing a native oxide which is formed at the surface of the substrate by normal oxidation and which is usually on the order of about 20 Angstroms in thickness. A further embodiment eliminates the oxide completely with the surface of the substrate having either no oxide or a very small native oxide thereon. In this latter case, the final device demonstrates no encroachment or "bird beak".

A polycrystalline silicon layer 9 is formed over the oxide layer 7 or directly onto the top of the substrate 1 if not oxide layer is formed, this layer being on the order of 500 to 1,000 Angstrom units in thickness. A silicon nitride layer 11 is formed over the polysilicon layer 9. The nitride layer is for patterning and is usually on the order of 1,000 to 2,000 Angstroms or possibly even more. The thicker the nitride layer is, the less encroachment will be observed. The intermediate device of FIG. 1b is then etched with an anisotropic etch in the region 13 where no nitride layer 11 exists to etch away therebelow each of the layers 7 and 9 down to the silicon substrate 1 as shown in FIG. 1c. The exposed portion 14 of the substrate 1 which is the field region, is then oxidized by field oxidation to grow an oxide layer 13 as shown in FIG. 1d. It can be seen that, in this embodiment, since the substrate was not etched back into a recessed condition, the oxide 13 formed will extend above the top surface of the substrate in the active or moat "region". The nitride layer 11 is then removed in standard manner and the polysilicon layer 9 is then removed either by etching with a selective etch such as $CF_4+O_2$ or, alternatively, the polysilicon layer 9 can be oxidized and then etched with a silicon oxide etchant in well known manner. After removal of the polysilicon layer 9, the oxide layer 7 is also removed by etching in standard manner and the silicon substrate 1 is then oxidized in the active region 19 to form a gate oxide 15 wherein the nitride layer portion 5 and oxide layer portion 3 have just been removed. The result of this step is shown in FIG. 1e.

Figure 1E:
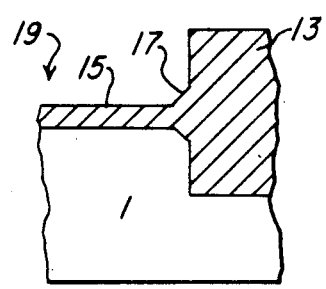
Figure 1C:
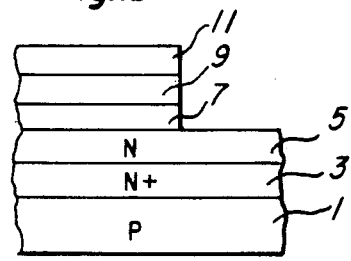
Figure 1C:
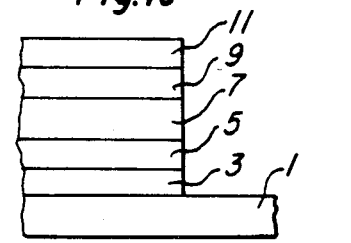
Figure 1D:
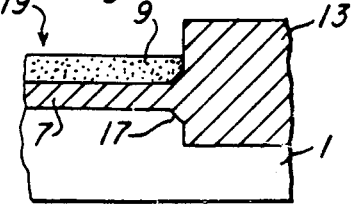
Figure 1F:
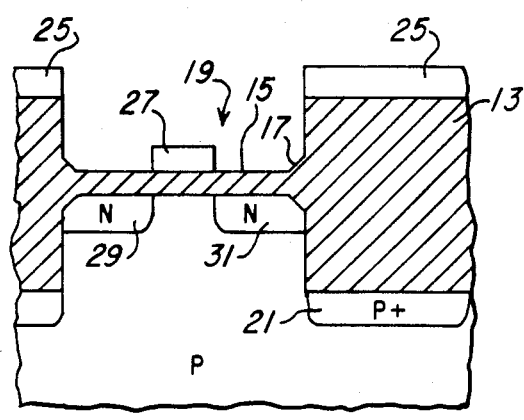

It can be seen in FIGS. 1d through 1f that the amount of oxide encroachment 17 into the moat region 19 is small in dimension relative to the size of the moat. It should also be understood that, in the event the oxide layer 7 was initially not formed, the encroachment portion 17 would essentially not exist.

In order to form an MOS device and with reference now to FIG. 1f, channel stops 21 and 23 are formed by ion implantation in standard manner and the device of FIG. 1f is then coated with a layer of polysilicon which is then etched away in the regions wherein the source and drain electrodes are to be formed to provide the structure as shown in FIG. 1f with a polysilicon region 25 over the field regions, a polysilicon gate region 27 and N-type regions 29 and 31 forming the source and the drain regions which are formed by ion implantations in the region from which the polysilicon has been removed. After etching away of the silicon oxide 15 over the source and drain regions and application of the contacts thereto and over the gate oxide 27, an MOS device is provided.

In accordance with the second embodiment of the invention, a substrate is provided identical to that of FIG. 1a and oxide layer 7, polysilicon 9 and patterned nitride layer 11 are formed thereon as in FIG. 1b. However, during etching, the substrate 1 is etched below the bottom level of the oxide layer 3 to a distance below said oxide layer 7 which is one half the level as shown in FIG. 1c' to which the oxide is later to be grown in said region as shown in FIG. 1d'. The remaining steps are identical to those set forth in FIG. 1 except that, during the formation of the oxide 13, as shown in FIG. 1d, said oxide layer will grow to approximately the same level or slightly above the oxide layer 7 as shown in FIG. 1d'. Processing will then continue as set forth with reference to FIG. 1.

Alternatively, in the event the bipolar device is to be formed, the processing steps required for formation of a bipolar device rather than an MOS device will be utilized, these being well known.

As further embodiments, the oxide layer 7 can be eliminated as a grown or deposited layer, the surface of the substrate 1 having over the N-type region 5 either a very thin nature oxide or essentially no oxide if the native oxide has not been formed. The processing steps are otherwise as set forth hereinabove.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A method for forming a semiconductor device comprising the steps of:
    (a) providing a silicon substrate;
    (b) forming a silicon oxide layer over said substrate, wherein said oxide layer has a thickness on the order of 100 angstroms;
    (c) forming a first layer of polycrystalline silicon over said oxide layer;
    (d) forming a second layer in the form of a pattern of predetermined shape over said first polycrystalline silicon layer with a material which inhibits silicon oxidation;
    (e) removing the silicon oxide and polycrystalline silicon not covered by said second layer pattern to expose a portion of said substrate;
    (f) oxidizing said exposed portion of said substrate;
    (g) removing the remainder of said first and second layers;
    (h) forming a semiconductor device in the region wherein the remainder of said first and second layers were removed.

2. The method of claim 1, wherein the oxide layer formed in step (b) is approximately 100 angstroms thick.

3. The method of claim 1, wherein, in step (e), a portion of said substrate is also removed.

* * * * *